United States Patent
Urakami et al.

(10) Patent No.: US 9,145,622 B2
(45) Date of Patent: Sep. 29, 2015

(54) MANUFACTURING METHOD OF SILICON CARBIDE SINGLE CRYSTAL

(75) Inventors: Yasushi Urakami, Obu (JP); Ayumu Adachi, Toyota (JP); Itaru Gunjishima, Aichi-gun (JP)

(73) Assignee: DENSO CORPORATION, Kariya (JP)

( * ) Notice: Subject to any disclaimer, the term of this patent is extended or adjusted under 35 U.S.C. 154(b) by 1037 days.

(21) Appl. No.: 13/245,934

(22) Filed: Sep. 27, 2011

(65) Prior Publication Data

US 2012/0073495 A1    Mar. 29, 2012

(30) Foreign Application Priority Data

Sep. 29, 2010    (JP) ................................. 2010-219348

(51) Int. Cl.
*C30B 23/00* (2006.01)
*C30B 29/36* (2006.01)

(52) U.S. Cl.
CPC ................. *C30B 29/36* (2013.01); *C30B 23/00* (2013.01)

(58) Field of Classification Search
USPC ........................... 117/89, 90, 94, 95, 101, 109
See application file for complete search history.

(56) References Cited

U.S. PATENT DOCUMENTS

| 7,501,022 B2 | 3/2009 | Mueller |
| 2005/0211156 A1 | 9/2005 | Gunjishima et al. |
| 2010/0083897 A1* | 4/2010 | Ohtani et al. ................... 117/84 |
| 2010/0089311 A1* | 4/2010 | Ohtani et al. ................... 117/84 |
| 2011/0206929 A1* | 8/2011 | Nakabayashi et al. ........ 428/367 |

FOREIGN PATENT DOCUMENTS

| JP | A-2002-121099 | 4/2002 |
| JP | 2004-262709 A | 9/2004 |
| JP | B2-4219800 | 7/2005 |
| JP | A-2006-52097 | 2/2006 |

OTHER PUBLICATIONS

Office Action mailed Sep. 3, 2013 in corresponding JP Application No. 2010-219348 (and English translation).

* cited by examiner

*Primary Examiner* — Robert M Kunemund
(74) *Attorney, Agent, or Firm* — Posz Law Group, PLC

(57) ABSTRACT

In a manufacturing method of a silicon carbide single crystal, a seed crystal made of silicon carbide is prepared. The seed crystal has a growth surface and a stacking fault generation region and includes a threading dislocation that reaches the growth surface. The growth surface is inclined at a predetermined angle from a (0001) plane. The stacking fault generation region is configured to cause a stacking fault in the silicon carbide single crystal when the silicon carbide single crystal is grown. The stacking fault generation region is located at an end portion of the growth surface in an offset direction that is a direction of a vector defined by projecting a normal vector of the (0001) plane onto the growth surface. The seed crystal is joined to a pedestal, and the silicon carbide single crystal is grown on the growth surface of the seed crystal.

13 Claims, 12 Drawing Sheets

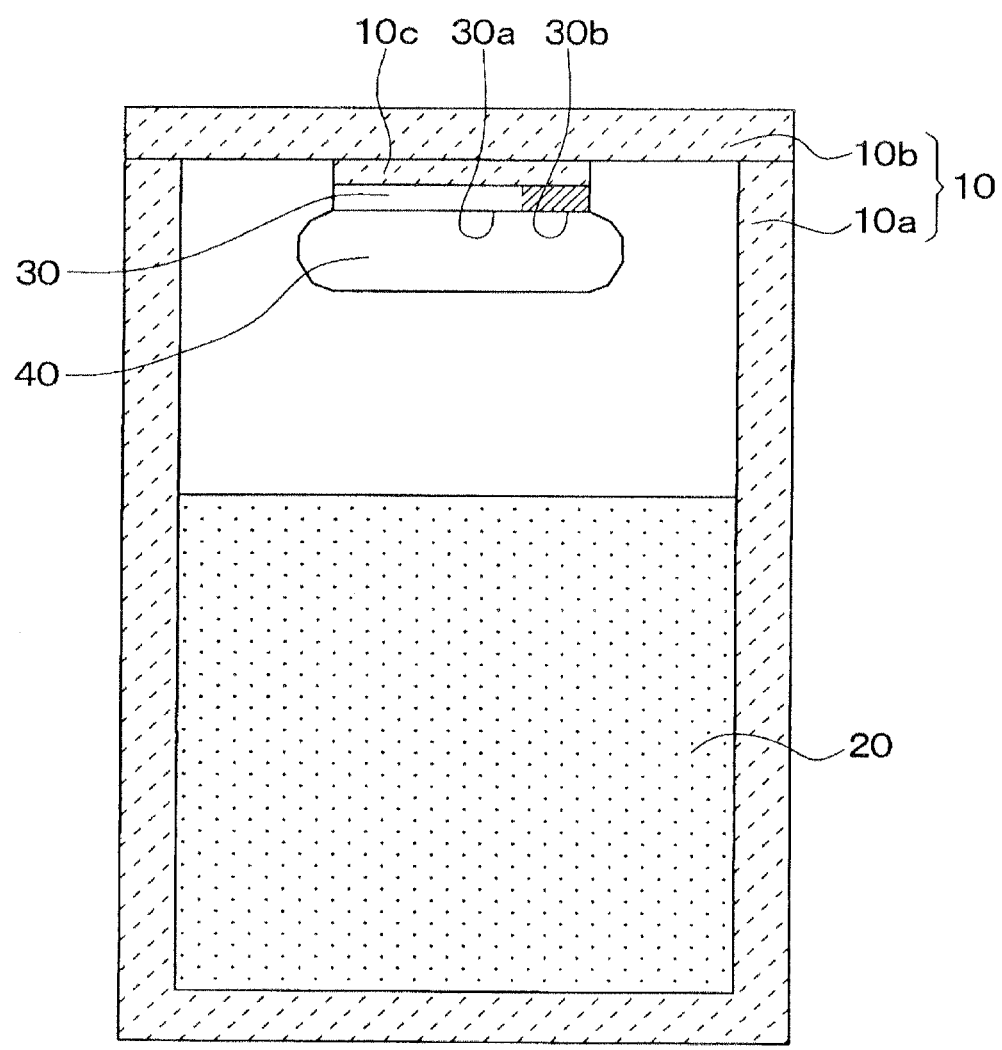

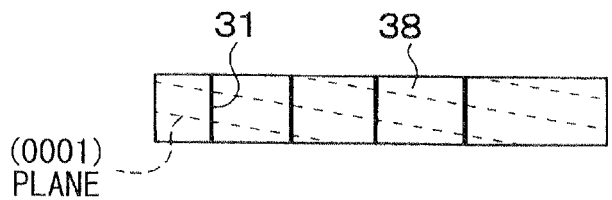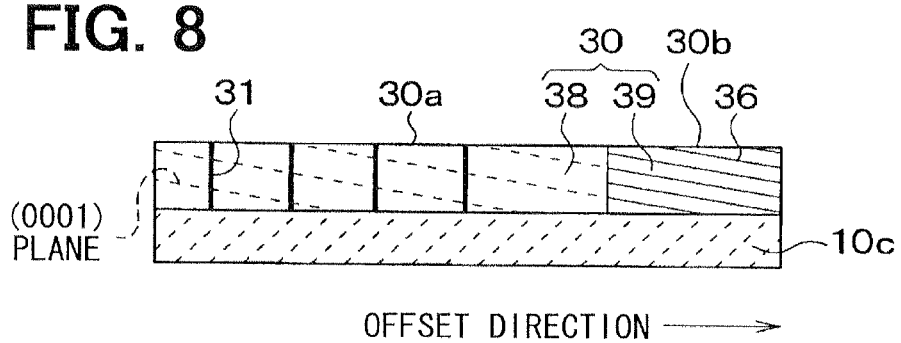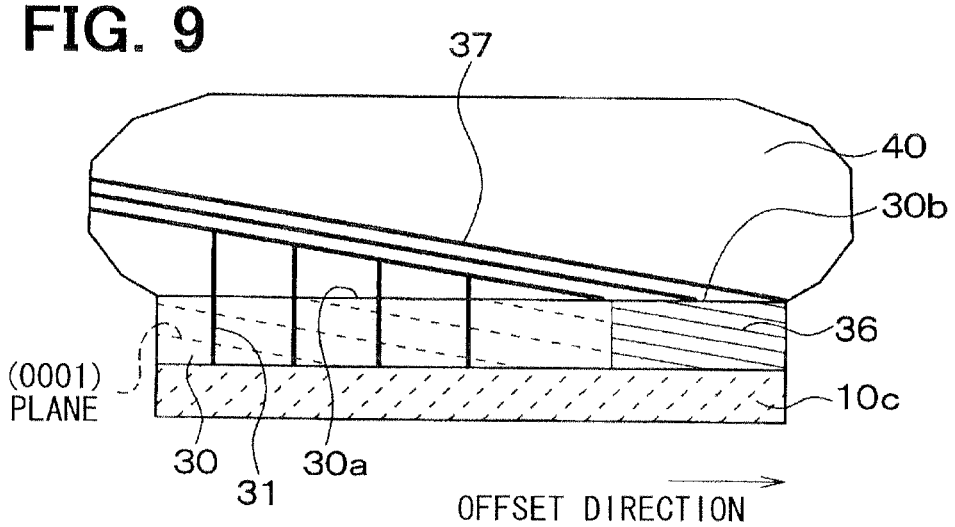

MANUFACTURING METHOD OF SILICON CARBIDE SINGLE CRYSTAL

CROSS REFERENCE TO RELATED APPLICATIONS

The present application is based on and claims priority to Japanese Patent Application No. 2010-219348 filed on Sep. 29, 2010, the contents of which are incorporated in their entirety herein by reference.

TECHNICAL FIELD

The present invention relates to a manufacturing method of a silicon carbide (hereafter, referred to as SiC) single crystal.

BACKGROUND

Conventionally, a SiC semiconductor device made of a SiC single crystal is expected to serve as alternative device to a Si semiconductor device for a next generation power device. In order to manufacture a SiC power device with a high performance, it is required to reduce leakage current generated in SiC semiconductor and to restrict reduction of breakdown voltage of the SiC semiconductor. The leakage current and the reduction of the breakdown voltage of the SiC semiconductor are caused by defects, such as dislocations, generated in a SiC single crystal.

A sublimation recrystallization method is known as one of methods of growing a SiC single crystal. In the sublimation recrystallization method, for example, a seed crystal is joined to a pedestal disposed in a crucible made of graphite, and SiC source powder is disposed at a bottom of the crucible. Then, the SiC source powder is heated and sublimated, and sublimation gas is supplied to a growth surface of the seed crystal. Accordingly, a SiC single crystal grows on the growth surface of the seed crystal.

In the sublimation recrystallization method, if a threading dislocation that reaches the growth surface of the seed crystal exists, the SiC single crystal grows while inheriting the threading dislocation, and the threading dislocation is not reduced.

In order to solve the above-described issue, for example, JP-A-2002-121099, JP-A-2006-052097, and U.S. Pat. No. 7,501,022 disclose methods in which a seed crystal having a groove on a growth surface of the (0001) plane is used, and a SiC single crystal is grown on the growth surface of the seed crystal in the <0001> direction. In the groove on the growth surface of the seed crystal, depositing probability of atoms that contribute a crystal growth is higher in a direction perpendicular to the <0001> direction than in the <0001> direction that is a growth direction. Thus, the groove is filled with the SiC single crystal grown in the direction perpendicular to the <0001> direction, and thereby a threading dislocation is less likely to grow in the SiC single crystal. As the groove provided on the growth surface, for example, JP-A-2006-052097 discloses a groove having a wall perpendicular to the growth surface and a groove having a wall inclined from the growth surface.

However, in the above-described methods, in a case where the groove has a low aspect ratio, that is, in a case where the groove is wide and shallow, a growth ratio from a sidewall of the groove is small. Thus, a SiC single crystal does not sufficiently grow on a plane inclined from the (0001) plane, and a SiC single crystal may grow in the <0001> direction from a bottom of the groove. In the above-described case, a threading dislocation may grow in the SiC single crystal that grows from the bottom of the groove. In contrast, in a case where groove has a high aspect ratio, that is, in a case where the groove is narrow and deep, an opening portion of the groove is filled when the SiC single crystal grows, and a hollow portion may be provided in the SiC single crystal. In the above-described case, stress may be caused due to the hollow portion, and new defects may be generated.

JP-A-2006-052097 discloses that generation of a hollow portion can be restricted when an aspect ratio (i.e., depth/width) of a groove is within a range from 0.1 to 3. However, it is difficult to form such a groove with high accuracy, and a manufacturing process may be complicated.

Furthermore, in the manufacturing method using a seed crystal having a groove on a growth surface, because a crystal grows in a direction perpendicular to the <0001> direction, that is, from a pair of sidewalls opposite to each other, a joint surface is formed at a center portion of the groove. Thus, mismatching of lattice plane may be caused, for example, by thermal distortion, and a new defect may be generated in the joint surface.

The above-described issue may be caused not only in a case where a SiC single crystal is grown on a seed crystal by a sublimation recrystallization method but also in a gas supply method in which a SiC single crystal is grown in a seed crystal by introducing source gas into a crucible.

SUMMARY

In view of the foregoing problems, it is an object of the present invention to provide a manufacturing method that can grow a high quality SiC single crystal without forming a groove on a growth surface of a seed crystal.

In a manufacturing method of a SiC single crystal according to an aspect of the present invention, a seed crystal made of silicon carbide is prepared. The seed crystal has a growth surface and a stacking fault generation region. The seed crystal includes a threading dislocation that reaches the growth surface. The growth surface is inclined at a predetermined angle from a (0001) plane. The stacking fault generation region is configured to cause a stacking fault in the SiC single crystal when the SiC single crystal is grown. The stacking fault generation region is located at an end portion of the growth surface in an offset direction that is a direction of a vector defined by projecting a normal vector of the (0001) plane onto the growth surface. The seed crystal is joined to a pedestal, and the SiC single crystal is grown on the growth surface of the seed crystal.

In the above-described manufacturing method, when the SiC single crystal is grown on the growth surface of the seed crystal, the threading dislocation that reaches the growth surface is inherited in the SiC single crystal and the stacking fault generation region causes the stacking fault in the SiC single crystal. When the growth of the SiC single crystal progresses, the threading dislocation collides against a portion where the stacking fault is generated and the threading dislocation is converted into the stacking fault. Thus, the threading dislocation is restricted from growing over the stacking fault, and a high quality SiC single crystal can be formed on an opposite side of the stacking fault from the growth surface of the seed crystal.

BRIEF DESCRIPTION OF THE DRAWINGS

Additional objects and advantages of the present invention will be more readily apparent from the following detailed description of preferred embodiments when taken together with the accompanying drawings. In the drawings:

FIG. 1 is a cross-sectional view showing a state of growing a SiC single crystal by a manufacturing method according to a first embodiment;

FIG. 7A and FIG. 7B are cross-sectional views respectively showing a first substrate and a second substrate for forming a seed crystal used in a manufacturing method according to a second embodiment;

FIG. 8 is a cross-sectional view showing a state where the first substrate and the second substrate shown in FIG. 7A and FIG. 7B are joined to a pedestal;

FIG. 9 is a cross-sectional view showing a state of growing a SiC single crystal on a growth surface of the seed crystal shown in FIG. 8;

DETAILED DESCRIPTION OF THE PREFERRED EMBODIMENTS

In order to solve the above-described issue, the present inventors conducted the following experiment. In the experiment, a SiC single crystal is grown on a growth surface of a seed crystal, and the growth surface has no groove and is inclined at a predetermined angle from the (0001) plane. The present inventors found that in a case where a stacking fault is generated in the seed crystal so that a threading dislocation inherited from the seed crystal collides against a portion where a stacking fault is generated, the threading dislocation is less likely to grow at a portion located on a front side of the SiC single crystal in the growth direction with respect to the stacking fault, that is, at a portion of the SiC single crystal located on the opposite side of the stacking fault from the seed crystal. Although the reason for the above is not completely proved, the present inventors presume the mechanism as follows in a case where the threading dislocation is a threading screw dislocation.

Figure 19A:
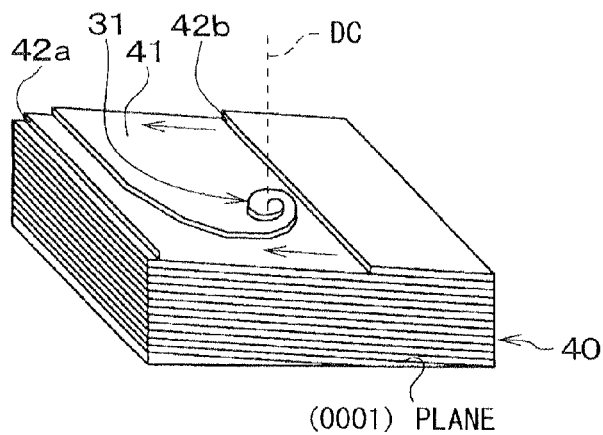
FIG. 19A to FIG. 19D are diagrams showing states where a threading screw dislocation grows.

First, growth of a SiC single crystal in a case where a stacking fault is not generated in the SiC single crystal will be described with reference to FIG. 19A to FIG. 19D. As shown in FIG. 19A, when a SiC single crystal 40 is grown on a growth surface of a seed crystal in which a plane inclined from the (0001) plane is used as the growth surface and a threading dislocation 31 reaches the seed crystal, the SiC single crystal 40 grows while inheriting the threading dislocation 31 in a growth direction. In the present case, the threading dislocation 31 is a threading screw dislocation, and an atomic arrangement on the growth surface of the SiC single crystal 40 has a step terrace structure including a flat terrace 41 of the (0001) plane and steps 42a, 42b. On the growth surface of the SiC single crystal 40, the threading dislocation 31 grows while rotating around a dislocation core (DC).

Figure 19B:
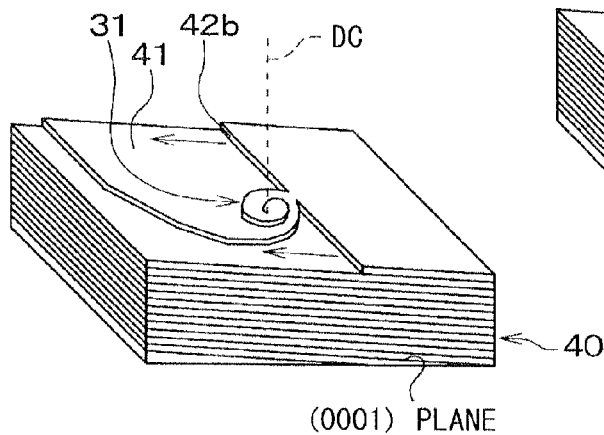
Figure 19C:
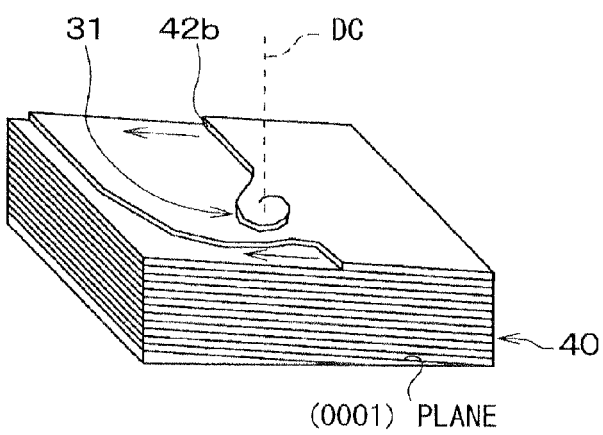
Figure 19D:
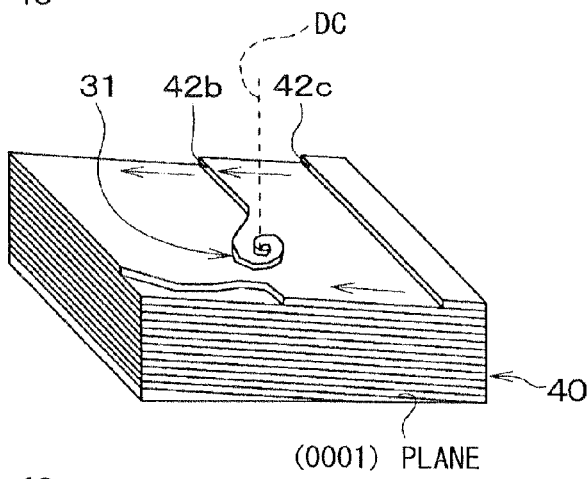

Then, as shown in FIG. 19B, when the growth of the SiC single crystal 40 progresses, the threading dislocation 31 combines with the step 42b. After that, the threading dislocation 31 grows while rotating around the dislocation core (DC) as shown in FIG. 19C, and the threading dislocation 31 grows until an end portion of the threading dislocation 31 becomes higher than the step 42c before the threading dislocation 31 combines with the next step 42c. Thus, in the case where the stacking fault is not generated in the SiC single crystal 40, the SiC single crystal 40 grows while repeating the processes shown in FIG. 19A to FIG. 19D, and the threading dislocation 31 grows in the growth direction of the SiC single crystal 40.

Next, growth of a SiC single crystal in a case where a stacking fault is generated in the SiC single crystal will be described with reference to FIG. 20A to FIG. 20E.

Figure 20A:
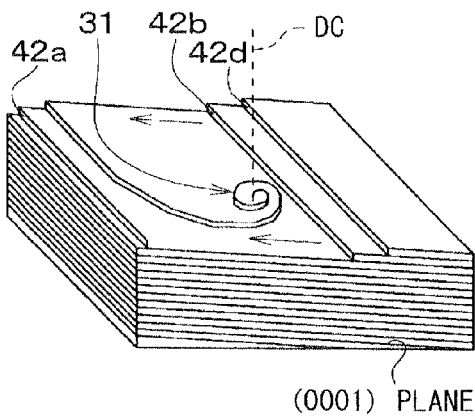
FIG. 20A to FIG. 20E are diagrams showing states where a threading screw dislocation grows.

As shown in FIG. 20A, the stacking fault is generated in a SiC single crystal 40 in a direction parallel to the (0001) plane, and an extra step 42d is inserted between adjacent steps 42b, 42c. Thus, a width (terrace width) between the adjacent steps 42b, 42c decreases. The step 42c is shown in FIG. 20E.

Figure 20B:
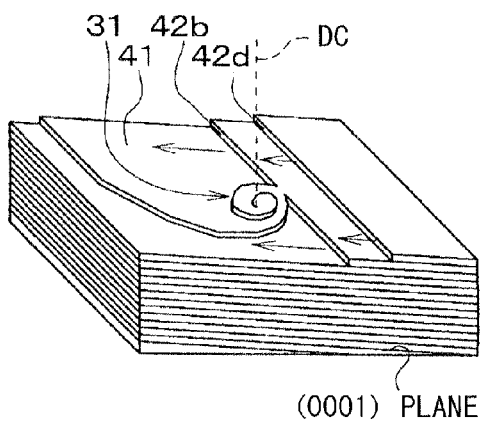
Figure 20C:
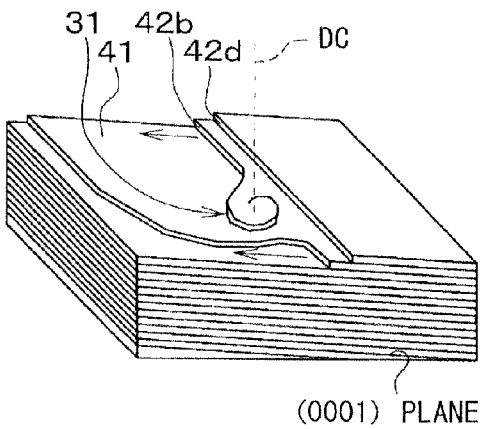
Figure 20D:
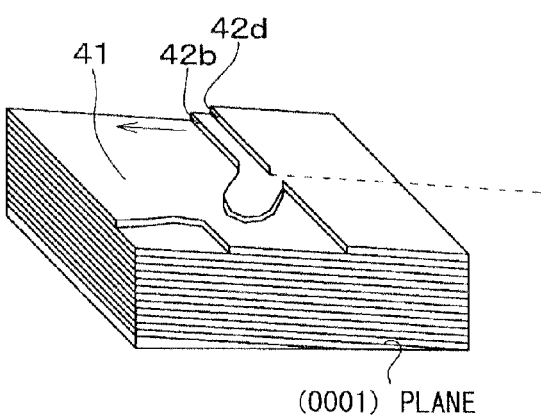
Figure 20E:
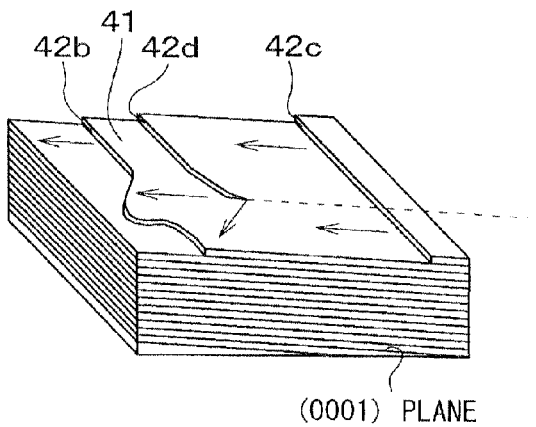

As shown in FIG. 20B, when the growth of the SiC single crystal 40 progresses, a threading dislocation 31 combines with the step 42b. After that, as shown in FIG. 20C, the threading dislocation 31 grows while rotating around the dislocation core (DC). Because the stacking fault is generated in the SiC single crystal 40 and the extra step 42d is introduced, the threading dislocation 31 reaches the next step 42d earlier than a case where the stacking fault is not generated. Thus, as shown in FIG. 20D, although the threading dislocation grows while rotating around the dislocation core (DC), the threading dislocation 31 combines with the next step 42d in a state where the end portion of the threading dislocation 31 is not higher than the next step 42d, and the threading dislocation 31 is integrated with a portion of the step 42d. Then, as shown in FIG. 20E, a portion of the step 42d that does not combine with the threading dislocation 31 become a stacking fault. In other words, when the threading dislocation 31 collides against a portion where the stacking fault is generated, that is, when the threading dislocation 31 collides against a portion in which a width of adjacent steps is small, the threading dislocation 31 is converted into a stacking fault.

Thus, the present inventors presume that when a threading screw dislocation collides against a portion where a stacking fault is generated, the threading screw dislocation is converted (absorbed) into the stacking fault, and the threading screw dislocation is less likely to grow on a front side of a SiC single crystal in a growth direction with respect to the stacking fault. A phenomenon that a threading dislocation is less likely to grow on a front side of a SiC single crystal in a growth direction with respect to a stacking fault similarly occurs also when the threading dislocation is a wave dislocation or a composite dislocation. The following embodiments are based on the above-described knowledge.

First Embodiment

A manufacturing method of a SiC single crystal according to a first embodiment will be described below.

As shown in FIG. 1, a manufacturing apparatus of a SiC single crystal includes a crucible 10 having a cylindrical shape and made of graphite. The crucible 10 has a bottom portion in which SiC source powder 20 is disposed. The SiC source powder 20 is sublimated by a heat treatment, and a SiC single crystal 40 is grown on a growth surface 30a of a seed crystal 30.

The crucible 10 includes a crucible body 10a having an opening portion at an upper end and a lid 10b covering the opening portion. The lid 10b includes a pedestal 10c protruding from a center portion of a lower surface, and the seed crystal 30 is joined to the pedestal 10c through adhesive (not shown).

On the outside of the crucible 10, a heating device (not shown) such as an induction coil is disposed so as to surround a periphery of the crucible 10. By controlling a power of the heating device, a temperature in the crucible 10 can be controlled. For example, when the SiC single crystal 40 is grown, a temperature of the seed crystal 30 is maintained to be lower than a temperature of the SiC source powder 20 by about 20° C. to about 200° C. by controlling the power of the heating device. Although it is not shown, the crucible 10 is housed in a vacuum chamber in which argon gas can be introduced, and the crucible 10 can be heated in the vacuum chamber.

Next, manufacturing processes of a SiC single crystal using the above-described manufacturing apparatus will be described.

Firstly, the seed crystal 30 made of SiC is prepared. The seed crystal has a growth surface 30a inclined at a predetermined angle from the (0001) plane and includes threading dislocations 31 that reach the growth surface 30a. The seed crystal 30 further includes a stacking fault generation region 30b that causes a stacking fault in the SiC single crystal 40. The stacking fault generation region 30b is located at an end portion of the growth surface 30a in an offset direction. The offset direction is a direction of a vector provided by projecting a normal vector of the (0001) plane onto the growth surface 30a. The seed crystal 30 can be manufactured through processes shown in FIG. 2A to FIG. 2D.

Figure 2A:
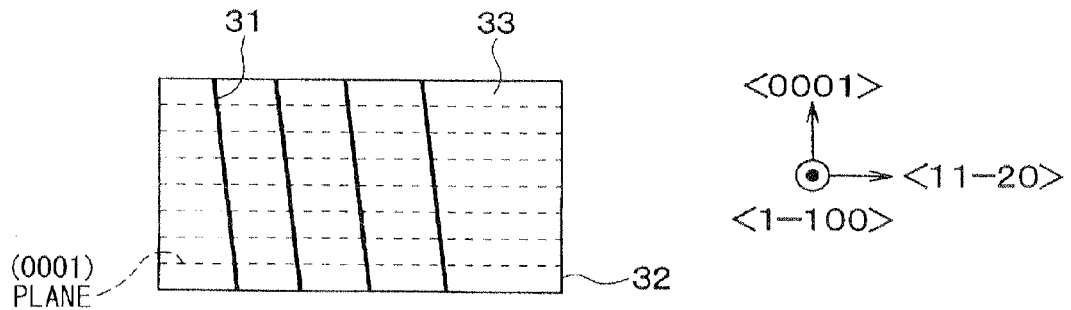
FIG. 2A to FIG. 2D are cross-sectional views showing manufacturing processes of a seed crystal used in the manufacturing method according to the first embodiment.

Firstly, as shown in FIG. 2A, a first substrate 33 having a block shape is prepared. The first substrate 33 is made of 4H—SiC and has an a-plane 32 that is perpendicular to the (0001) plane. The first substrate 33 includes threading dislocations 31. The threading dislocations 31 may be perpendicular to the (0001) plane and the threading dislocations 31 may also be inclined from a perpendicular line of the (0001) plane at an angle within a range from about −30 degrees to about 30 degrees. The a-plane 32 perpendicular to the (0001) plane includes, for example, the (1-100) plane and the (11-20) plane. In the present embodiment, the a-plane 32 is set to the (11-20) plane. In a case where the a-plane 32 is the (11-20) plane, compared with a case where the a-plane is the (1-100) plane, when a SiC single crystal 34 is grown in the following process shown in FIG. 2B, the number of steps in the SiC single crystal 34 is large. Thus, generation of different direction or different species polymorphism is restricted, and polymorphism can stably grow.

Figure 2B:
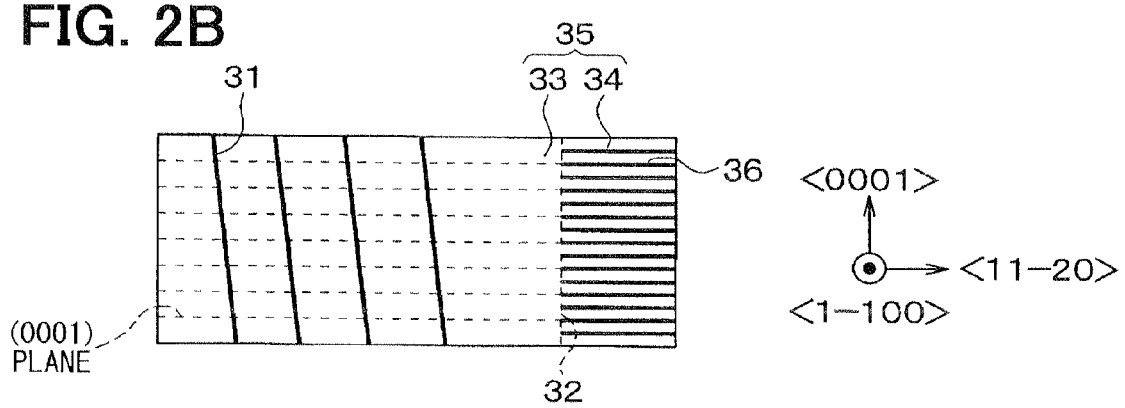

Next, as shown in FIG. 2B, the SiC single crystal 34 is grown on the a-plane 32 of the first substrate 33 in a direction perpendicular to the a-plane 32, that is, in the <11-20> direction, and thereby a second substrate 35 including the first substrate 33 and the SiC single crystal 34 is formed. In a case where the SiC single crystal 34 is grown in the direction perpendicular to the a-plane 32, a stacking fault 36 parallel to the (0001) plane is generated in the SiC single crystal 34.

The process shown in FIG. 2B can be performed, for example, as follows. As disclosed in Japanese Patent No. 4,219,800, the lid 10b in which a center portion is depressed toward an outside of the crucible body 10a to provide a housing portion is prepared. After a protective layer made of, for example, graphite is disposed on surfaces of the first substrate 33 other than the a-plane, the first substrate 33 is disposed on the lid 10b in such a manner that the a-plane 32 is opposite to the SiC source powder 20 and the most part of the first substrate 33 opposite from the a-plane 32 is housed in the housing portion. After that, the SiC source power 20 is sublimated to grow the SiC single crystal 34 on the first substrate 33.

The a-plane 32 of the first substrate 33 may include a broken layer in which a crystal structure is broken by lapping, for example, with a sandpaper. When the a-plane 32 includes the broken layer, the stacking fault 36 is easily generated in the SiC single crystal 34 compared with a case where the a-plane 32 does not include a broken layer and the a-plane 32 has, for example, a mirror-finished surface. Also in a case where the a-plane 32 of the first substrate 33 has the mirror-finished surface, the stacking fault 36 can be generated in the SiC single crystal 34 by growing the SiC single crystal 34 in the direction perpendicular to the a-plane 32.

The first substrate 33 is prepared, for example, by cutting a 4H—SiC ingot manufactured by a conventional manufacturing method of a SiC single crystal. The SiC single crystal 34 may be grown on a condition different from a condition at a time when the ingot for providing the first substrate 33 is manufactured. For example, in a case where a predetermined concentration of nitrogen is doped in the first substrate 33, the SiC single crystal 34 may be grown so as to have a nitrogen concentration different from the first substrate 33. For example, in a case where the first substrate 33 has a nitrogen concentration of $1.0 \times 10^{18}$ atm/cm$^3$, the SiC single crystal 34 having a nitrogen concentration of $1.0 \times 10^{19}$ atm/cm$^3$ may be grown on the a-plane 32. When the SiC single crystal 34 having the different nitrogen concentration from the first substrate 33 is formed on the a-plane 32, a lattice mismatching is easily generated in the a-plane 32 and the stacking fault 36 is easily generated in the SiC single crystal 34. Especially when the SiC single crystal 34 having a nitrogen concentration of greater than or equal to $2.0 \times 10^{19}$ atm/cm$^3$ is grown on the a-plane 32, the stacking fault 36 can be generated more easily in the SiC single crystal 34.

Figure 2C:
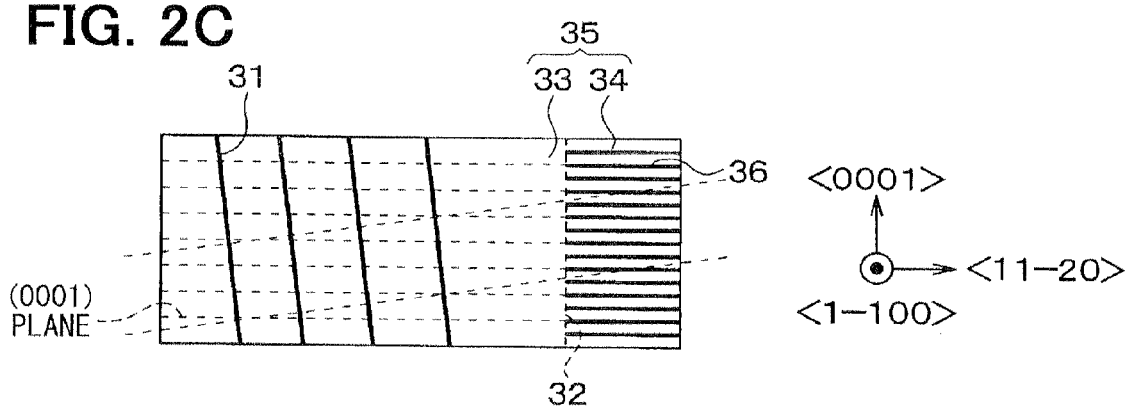

Next, as shown in FIG. 2C, the second substrate 35 is cut out at a plane inclined at a predetermined angle from the (0001) plane, for example, using a wire saw apparatus. In a case where the SiC single crystal 34 is grown on the a-plane of the (11-20) plane, a step is formed into zigzag and a step of a cut-out surface is also zigzag compared with a case where the SiC single crystal 34 is grown on the a-plane 32 of the (1-100) plane, Thus, when a SiC single crystal 40 is grown, molecules that reach a surface is easily introduced when the molecules diffuse, generation of different direction or different polymorphism is restricted, and polymorphism can be stably grown. The above-described effects can also be obtained when the SiC single crystal is formed in a direction perpendicular to the <0001> direction and is inclined at an angle with a range from −15 degrees to 15 degrees from the <11-20> direction. In other words, although the a-plane 32 is set to the (11-20) plane in the above-described example, a perpendicular line of the a-plane 32 may be perpendicular to the <0001> direction and may be inclined at an angle from −15 degree to 15 degree from the <11-20> direction.

Figure 2D:
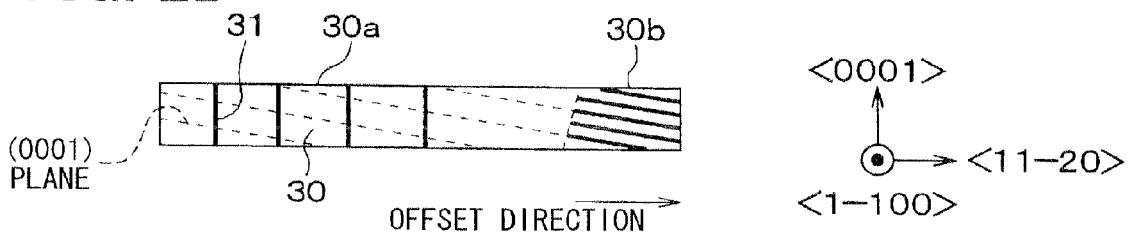

Then, as shown in FIG. 2D, the cut-out substrate is processed into a predetermined shape, and the cut-out surface is polished, for example, by chemical mechanical polishing (CMP). Accordingly, the seed crystal 30 is formed. In the seed crystal 30, the cut-out surface of the second substrate 35 forms the growth surface 30a, and the cut-out surface of the SiC single crystal 34 forms the stacking fault generation region 30b.

In the present embodiment, the seed crystal 30 has a rectangular shape as an example. In FIG. 2D, the seed crystal 30 has a width of about 30 mm in the left to right direction and a length of about 20 mm in a depth direction. The stacking fault generation region 30b has a width with a range from about 0.1 mm to about 10 mm in the left to right direction. When the SiC single crystal 40 is grown on the growth surface 30a of the seed crystal 30, the amount of stacking fault generated in the SiC single crystal 40 depends on the width of the stacking fault generation region 30b. The amount of stacking fault generated in the SiC single crystal 40 increases with the width of the stacking fault generation region 30b.

Then, the seed crystal 30 is disposed on the pedestal 10c in such a manner that the growth surface 30a is located opposite to the SiC source powder 20. The crucible 10 is heated to a temperature within a range from 2100° C. to 2300° C. at a pressure within a range from $1.3 \times 10^2$ Pa (about 1 Torr) to $1.3 \times 10^3$ Pa (about 10 Torr). The temperature of the seed crystal 30 is maintained to be lower than the temperature of the SiC source powder 20 by a temperature within a range from 20° C. to 200° C. Accordingly, the SiC source powder 20 in the crucible 10 is sublimated by heating and is deposited on the seed crystal 30 which is at lower temperature than the SiC source powder 20.

Figure 3:
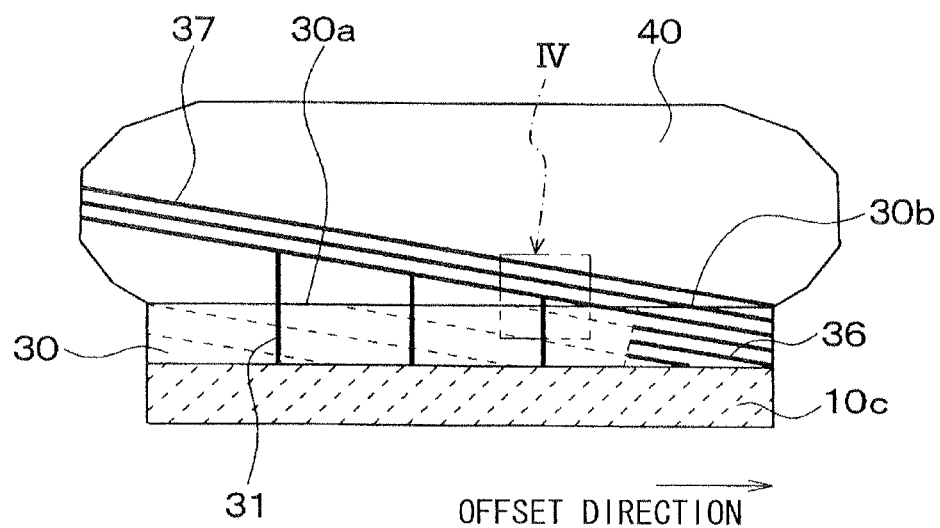
FIG. 3 is a cross-sectional view showing a state of growing a SiC single crystal on a growth surface of a seed crystal.
Figure 4A:
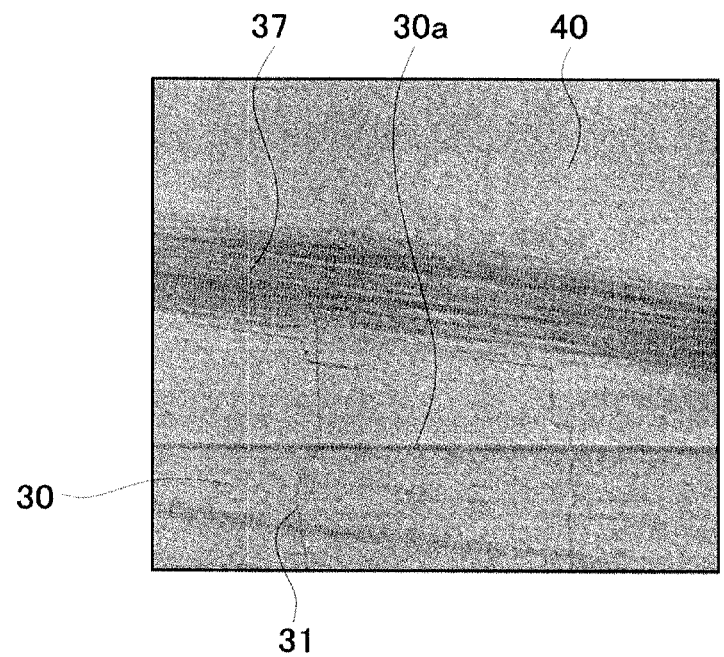
FIG. 4A is an X-ray topography image of a portion surrounded by a dashed-two dotted line in FIG. 3
Figure 4B:
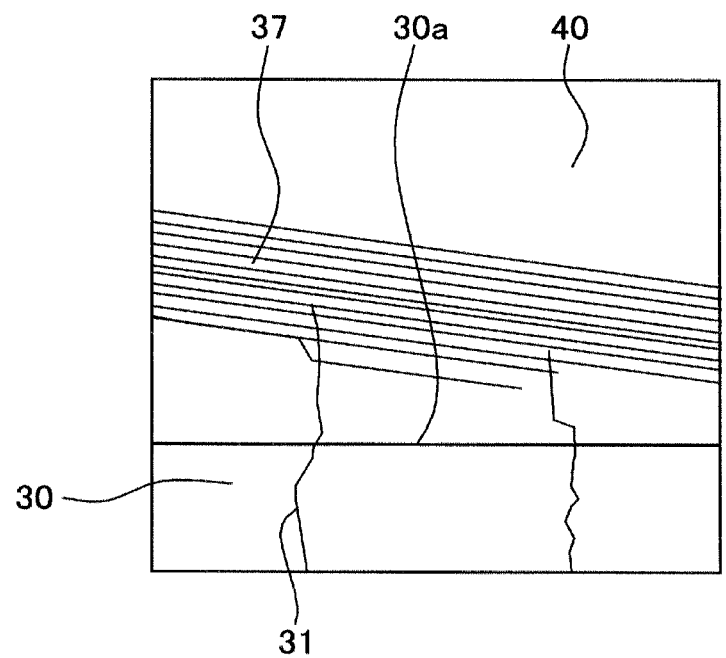
FIG. 4B is an illustrative diagram of the X-ray topography image shown in FIG. 4A.

FIG. 3 is a cross-sectional view showing a state of growing the SiC single crystal 40 on the growth surface 30a of the seed crystal 30. FIG. 4A is an X-ray topography image of a portion surrounded by a dashed-two dotted line in FIG. 3 and FIG. 4B is an illustrative diagram of the X-ray topography image shown in FIG. 4A. In the example shown in FIG. 3, FIG. 4A and FIG. 4B, the SiC single crystal 40 is grown on the seed crystal 30 in which an angle between the (0001) plane and the growth surface 30a, that is, an offset angle is 8 degrees.

As shown in FIG. 3, FIG. 4A and FIG. 4B, at a portion of the SiC single crystal formed in a growth early stage, that is, at a portion of the SiC single crystal 40 adjacent to the seed crystal 30, the SiC single crystal 40 is grown while inheriting the threading dislocations 31 that reach the growth surface 30a of the seed crystal 30 and the stacking fault 36 in the stacking fault generation region 30b. The threading dislocations 31 grow in the growth direction of the SiC single crystal, that is, in a direction perpendicular to the growth surface 30a, and a stacking fault 37 grows in a direction parallel to the (0001) plane.

When the growth of the SiC single crystal 40 progresses, the threading dislocations 31 inherited in the SiC single crystal 40 collide against a portion where the stacking fault 37 is generated, and the threading dislocations 31 are converted (absorbed) into the stacking fault 37. Thus, the threading dislocations 31 are restricted from growing over the stacking fault 37.

When the growth the SiC single crystal 40 further progresses, the SiC single crystal 40 in which the growth of the threading dislocations 31 is restricted can be manufactured at a portion located on a front side of the SiC single crystal 40 in the growth direction with respect to the stacking fault 37.

Figure 5A:
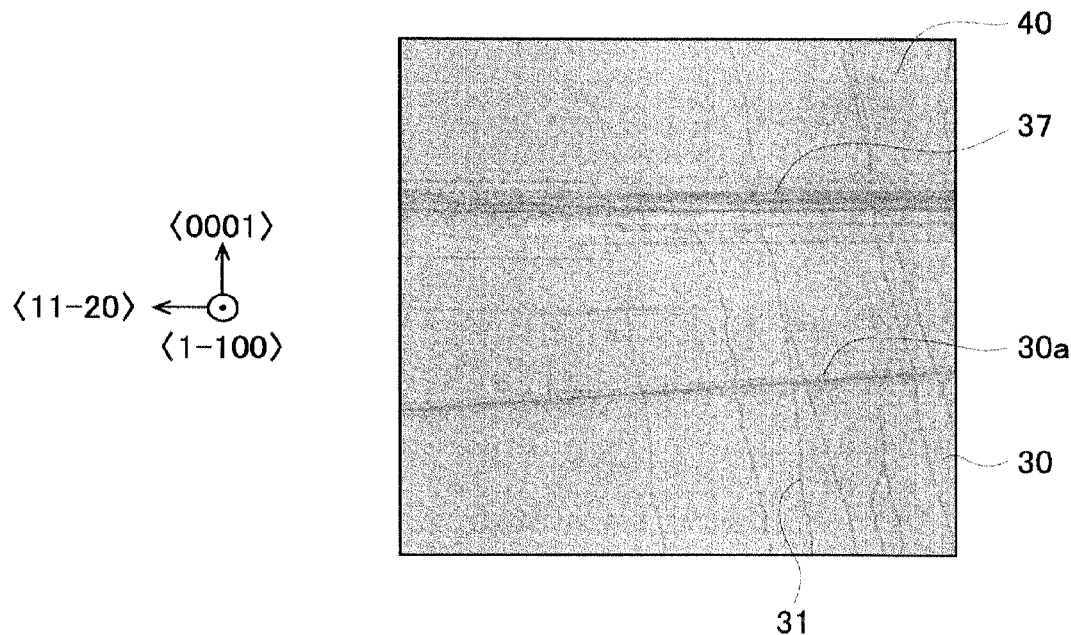
FIG. 5A is an X-ray topography image of a SiC single crystal in a case where the SiC single crystal is grown on a seed crystal having an offset angle of 4 degrees and FIG. 5B is an illustrative diagram of the X-ray topography image shown in FIG. 5A.
Figure 5B:
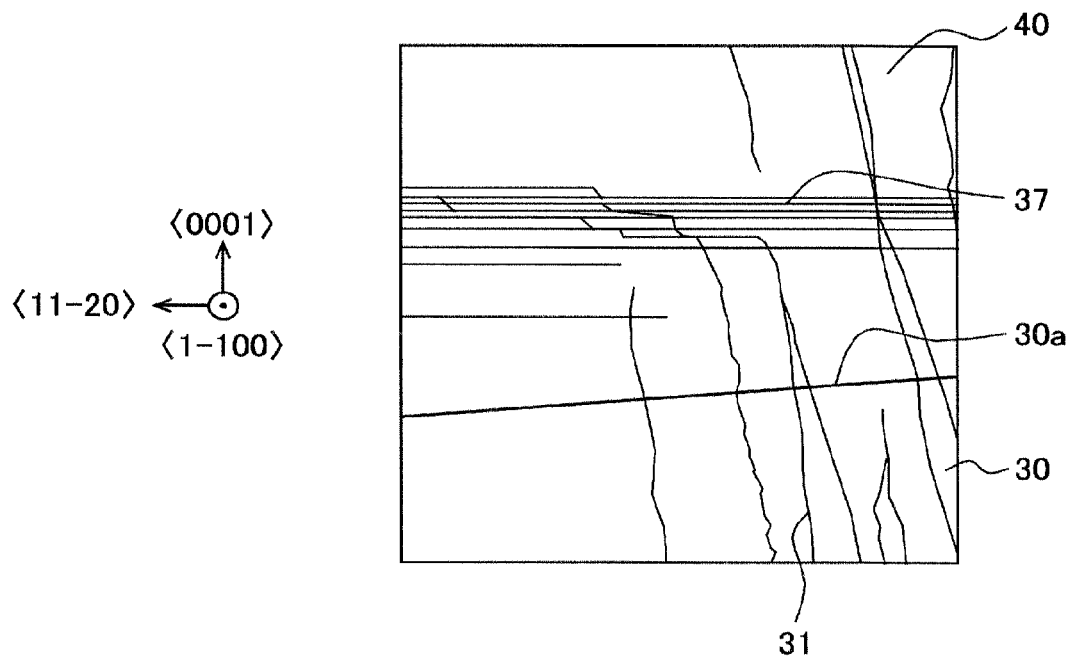
Figure 6A:
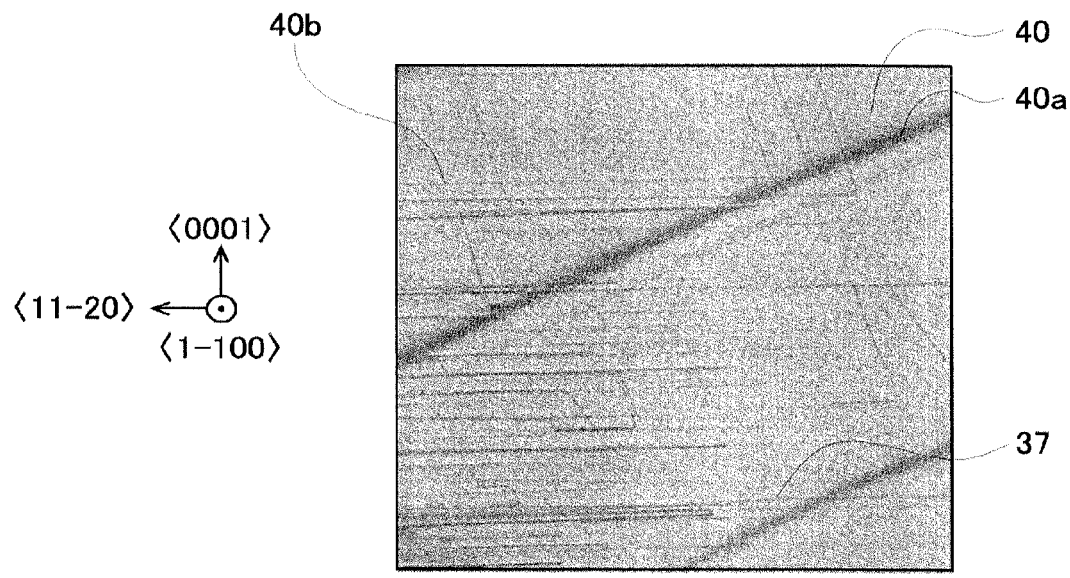
FIG. 6A is an X-ray topography image of a SiC single crystal in a case where an angle between a (0001) plane and a marking layer is 30 degrees and FIG. 6B is an illustrative diagram of the X-ray topography image shown in FIG. 6A.
Figure 6B:
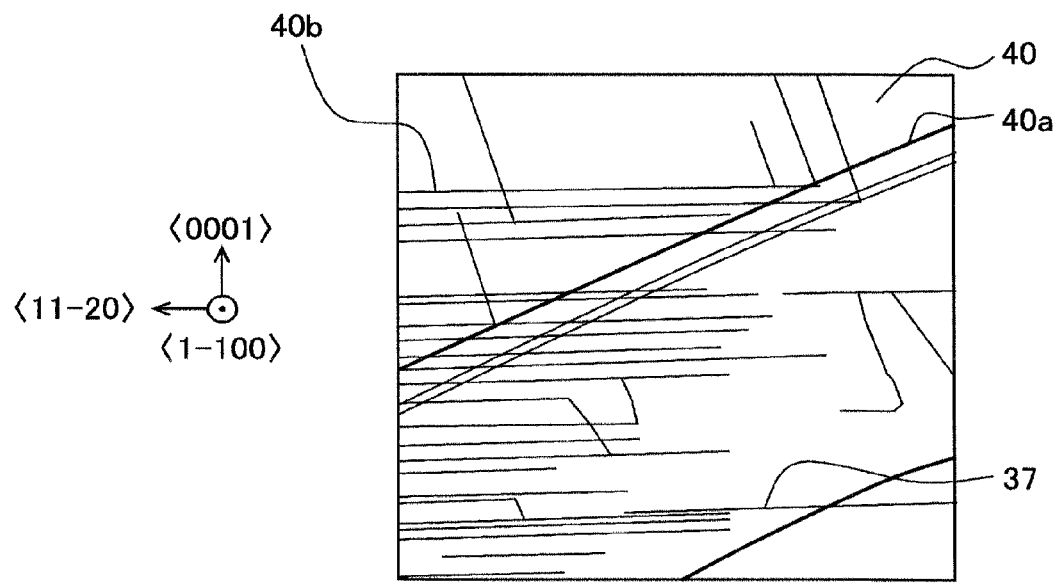

The seed crystal 30 may have an angle between the (0001) plane and the growth surface 30a, that is, an offset angle of greater than 4 degrees and less than 30 degrees. FIG. 5A is an X-ray topography image of the SiC single crystal 40 in a case where the SiC single crystal 40 is grown on the seed crystal 30 having an offset angle of 4 degrees and FIG. 5B is an illustrative diagram of the X-ray topography image shown in FIG. 5A. FIG. 6A is an X-ray topography image of the SiC single crystal 40 in a case where an angle between the (0001) plane and a marking layer 40a is 30 degrees and FIG. 6B is an illustrative diagram w of the X-ray topography image shown in FIG. 6A. The marking layer 40a is a portion of a growth surface of the SiC single crystal 40 marked by changing a nitrogen concentration when the SiC single crystal 40 is formed. The threading dislocations 31 shown in FIG. 5A, FIG. 5B, FIG. 6A, and FIG. 6B are threading screw dislocations.

As shown in FIG. 5A and FIG. 5B, when the offset angle is 4 degrees, some threading dislocations 31 inherited in the SiC single crystal 40 is converted (absorbed) into the stacking fault 37, and the other threading dislocations 31 inherited in the SiC single crystal 40 grow over the stacking fault 37. The reason of above phenomenon can be considered as follows. In a case where the threading dislocation 31 is a threading screw dislocation and the offset angle is as small as 4 degrees, a width between adjacent steps (terrace width) is large. Thus, even when the stacking fault 37 is introduced, a step forming the threading screw dislocation can grow while rotating around a dislocation center of the threading screw dislocation. Therefore, although growth of the threading dislocations 31 can be partially restricted even in a case where the offset angle is 4 degrees, growth of the threading dislocations 31 can be restricted more certainly and the SiC single crystal 40 can have a high quality in a case where the offset angle is greater than 4 degrees.

As shown in FIG. 6A and FIG. 6B, in a case where the angle between the (0001) plane and the growth surface (i.e., the marking layer 40a) is 30 degrees, new stacking fault 40b is generated in the SiC single crystal 40. In other words, the stacking fault 40b not depending on the stacking fault generation region 30b is generated. This is because growth of the SiC single crystal in the a-axis direction that is perpendicular to the <0001> direction can be dominant during the growth of the SiC single crystal 40. Thus, although the growth of the threading dislocations 31 can be restricted by increasing the angle between the (0001) plane and the growth surface of the SiC single crystal, that is, the offset angle, the new stacking fault 40b may be generated in the SiC single crystal 40 in a case where the offset angle is greater than or equal to 30 degrees. Thus, the offset angle may be less than 30 degree.

As described above, in the manufacturing method of the SiC single crystal according to the present embodiment, the seed crystal 30 has the growth surface 30a inclined at a predetermined angle from the (0001) plane and has the stacking fault generation region 30b for causing the stacking fault 37 in the SiC single crystal 40 at the end portion of the growth surface 30a in the offset direction, and the SiC single crystal 40 is grown on the growth surface 30a of the seed crystal 30.

In the manufacturing method, when the SiC single crystal 40 is grown on the growth surface 30a, the threading dislocations 31 that reach the growth surface 30a of the seed crystal 30 are inherited in the SiC single crystal 40, and the stacking fault 37 is caused from the stacking fault generation portion 30b. When the growth of the SiC single crystal 40 progresses, the threading dislocations 31 collide against the portion where the stacking fault 37 is generated and the threading dislocations 31 are converted (absorbed) into the stacking fault 37. Thus, the threading dislocations 31 are restricted from growing over the stacking fault 37 in the growth direction. Therefore, at the portion of the SiC single crystal 40 located on the front side in the growth direction with respect to the stacking fault 37, the high quality SiC single crystal 40 in which growth of the threading dislocations 31 is restricted can be manufactured.

In addition, by cutting out a seed crystal from the portion of the SiC single crystal 40 located on the front side in the growth direction with respect to the stacking fault 37 and growing a SiC single crystal on the seed crystal, a high quality wafer without a threading dislocation can be manufactured.

Because the stacking fault generation region 30b is formed at the end portion of the growth surface 30a in the offset direction, when the SiC single crystal 40 is grown, the SiC single crystal 40 can be divided into two portions located on opposite sides of the stacking fault 37, that is, the portion adjacent to the seed crystal 30 and the portion on the opposite side of the stacking fault 37 from the seed crystal 30. Thus, the threading dislocations 31 inherited in the SiC single crystal 40 can easily collide against the portion where the stacking fault is generated compared with a case where the stacking fault generation region 30b is not formed at the end portion of the growth surface 30a in the offset direction, for example, a case where the stacking fault generation region 30b is formed at an end portion of the growth surface 30a in an opposite direction of the offset direction.

In the above-described manufacturing method, it is not necessary to form a groove on the growth surface 30a of the seed crystal 30 with a high accuracy, and a manufacturing process can be simple.

Second Embodiment

A manufacturing method according to a second embodiment will be described below. In the present embodiment, the seed crystal 30 includes a first substrate 38 and a second substrate 39. Because the rest of the manufacturing method is similar to that of the manufacturing method according to the first embodiment, a description about the rest is omitted.

The first substrate 38 has threading dislocations 31 and has a growth surface 30a inclined at a predetermined angle from the (0001) plane as shown in FIG. 7A. The second substrate 39 has a growth surface 30a inclined from the (0001) plane at substantially the same angle with the first substrate 38. The second substrate 39 has a stacking fault 36 that extends in a direction parallel to the (0001) plane and reaches the inclined surface.

As shown in FIG. 8, the first substrate 38 and the second substrate 39 are disposed on the pedestal 10c in such a manner that a plane direction of the first substrate 38 and a plane direction of the second substrate 39 correspond with each other and the second substrate 39 is arranged on a side of the first substrate 38 in an offset direction. Accordingly, the seed crystal 30 including the first substrate 38 and the second substrate 39 is disposed on the pedestal 10c. The growth surface 30a of the second substrate 39 forms the stacking fault generation region 30b.

The offset angle of each of the first substrate 38 and the second substrate 39 may be greater than 4 degrees and less than 30 degrees. In the above description, substantially the same angle includes the same angle and an angle having a margin of error within ±1 degree.

When the SiC single crystal 40 is grown on the growth surface 30a of the seed crystal 30 according to the present embodiment, the SiC single crystal 40 grows as follows.

As shown in FIG. 9, the SiC single crystal 40 grows while inheriting the stacking fault 36 of the stacking fault generation region 30b. Thus, the threading dislocations 31 inherited in the SiC single crystal 40 collide against a portion where the stacking fault 37 is generated, and the threading dislocations 31 are restricted from growing over the stacking fault 37.

In the manufacturing method according to the present embodiment, it is not necessary to grow the SiC single crystal 34 which is required in the manufacturing method according to the first embodiment. Thus, manufacturing processes according to the present embodiment can be simpler than the manufacturing processes according to the first embodiment.

Third Embodiment

A manufacturing method of a SiC single crystal according to a third embodiment will be described. In the manufacturing method according to the present embodiment, a seed crystal 30 has a ramp 30c at an end portion of a growth surface 30a in the offset direction. Because the rest of the manufacturing method is similar to that of the manufacturing method according to the first embodiment, a description about the rest is omitted.

Figure 10:
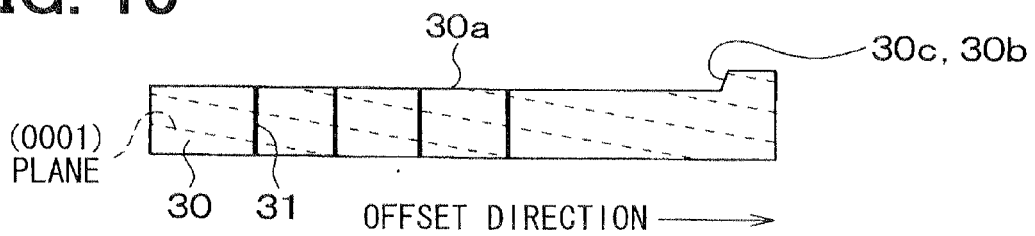
FIG. 10 is a cross-sectional view showing a seed crystal used in a manufacturing method of a SiC single crystal according to a third embodiment.

As shown in FIG. 10, in the present embodiment, the seed crystal 30 includes threading dislocations 31 and has the growth surface 30a inclined at a predetermined angle from the (0001) plane. At the end portion of the growth surface 30 in the offset direction, the seed crystal 30 has the ramp 30c protruding from the growth surface 30a. The ramp 30c forms a stacking fault generation region 30b.

The seed crystal 30 according to the present embodiment can be formed, for example, as follows. Firstly, a substrate having threading dislocations 31 and having a main surface inclined at the predetermined angle from the (0001) plane is prepared. Then, a thickness of a portion of the main surface other than the end portion in the offset direction is reduced by grinding, and the ramp 30c can be formed between a portion that is ground and a portion that is not ground.

In the present embodiment, the ramp 30c is the a-plane that is perpendicular to the (0001) plane and includes a broken layer. The ramp 30c may have a height with a range from a few μm to a few hundred μm.

When the SiC single crystal 40 is grown on the growth surface 30a of the seed crystal 30 according to the present embodiment, the SiC single crystal 40 grows as follows.

Figure 11:
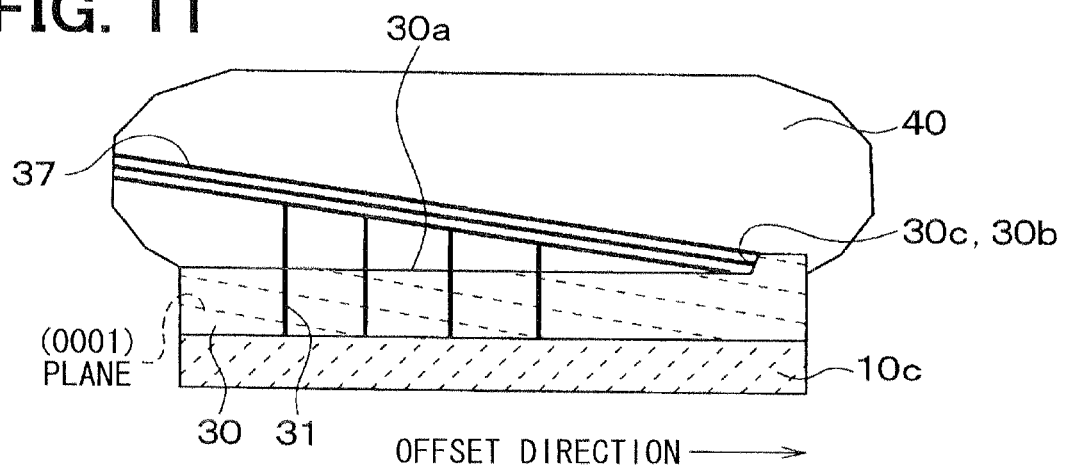
FIG. 11 is a cross-sectional view showing a state of growing a SiC single crystal on the seed crystal shown in FIG. 10.

As shown in FIG. 11, when the SiC single crystal 40 is grown on the ramp 30c that provides the stacking fault generation region 30b, the SiC single crystal 40 is grown in a direction perpendicular to the ramp 30c, that is, in a direction perpendicular to the a-plane. Thus, the SiC single crystal 40 grows while generating the stacking fault 37. Thus, the threading dislocations 31 inherited in the SiC single crystal 40 collide against a portion where the stacking fault 37 is generated, and the threading dislocations 31 are restricted from growing over the stacking fault 37 in the growth direction.

In the manufacturing method according to the present embodiment, it is not necessary to grow the SiC single crystal 34 which is required in the manufacturing method according to the first embodiment. Thus, manufacturing processes according to the present embodiment can be simpler than the manufacturing processes according to the first embodiment.

Fourth Embodiment

A manufacturing method of a SiC single crystal according to a fourth embodiment will be described below. In the present embodiment, a seed crystal 30 has a broken layer at an end portion of a growth surface 30a in an offset direction. Because the rest of the manufacturing method is similar to that of the manufacturing method according to the first embodiment, a description about the rest is omitted.

Figure 12:
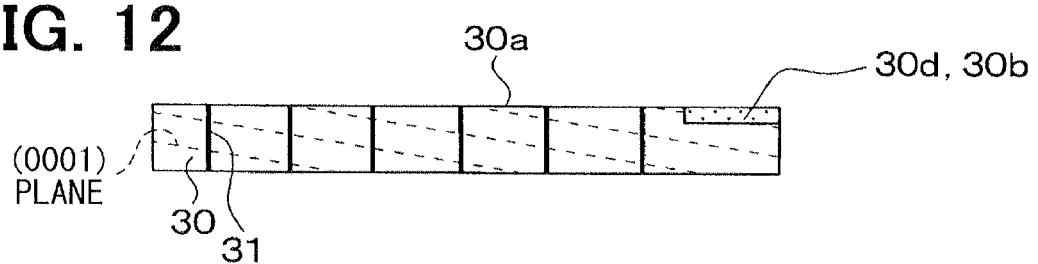
FIG. 12 is a cross-sectional view showing a seed crystal used in a manufacturing method of a SiC single crystal according to a fourth embodiment.

As shown in FIG. 12, the seed crystal 30 according to the present embodiment includes threading dislocations 31 and has the growth surface 30a inclined at a predetermined angle from the (0001) plane. The seed crystal 30 further has a broken layer 30d for forming a stacking fault generation region 30b at the end portion in the offset direction.

The seed crystal 30 according to the present embodiment can be formed, for example, as follows. Firstly, a substrate having the threading dislocations 31 and having the growth surface 30a inclined at the predetermined angle from the (0001) plane is prepared. Then, the broken layer 30d is formed at the end portion of the growth surface 30a in the offset direction, for example, by roughly grinding with a grindstone, a sandpaper, or a diamond or dicing.

When a SiC single crystal 40 is grown on the growth surface 30a of the seed crystal 30 according to the present embodiment, the SiC single crystal 40 grows a follows.

Figure 13:
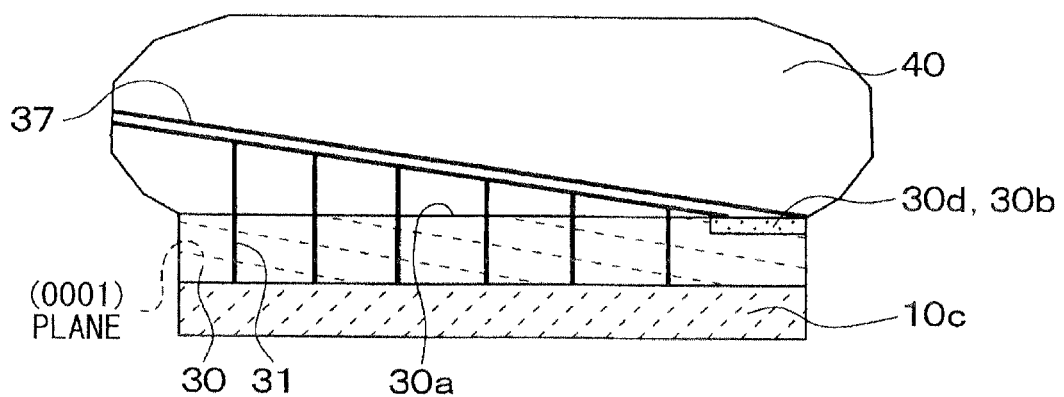
FIG. 13 is a cross-sectional view showing a state of growing a SiC single crystal on the seed crystal shown in FIG. 12.

As shown in FIG. 13, when the SiC single crystal 40 is formed on the broken layer 30d that forms the stacking fault generation region 30b, the SiC single crystal 40 grows while generating a stacking fault 37. Thus, the threading dislocations 31 inherited in the SiC single crystal 40 collide against a portion where the stacking fault 37 is generated, and the threading dislocations 31 are restricted from growing over the stacking fault 37.

In the manufacturing method according to the present embodiment, it is not necessary to grow the SiC single crystal 34 which is required in the manufacturing method according to the first embodiment. Thus, manufacturing processes according to the present embodiment can be simpler than the manufacturing processes according to the first embodiment.

Fifth Embodiment

A manufacturing method of a SiC single crystal according to a fifth embodiment will be described. In the manufacturing method according to the present embodiment, a first substrate 33 having a cylindrical shape is used. Because the rest of the manufacturing method is similar to that of the manufacturing method according to the first embodiment, a description about the rest is omitted.

Figure 14A:
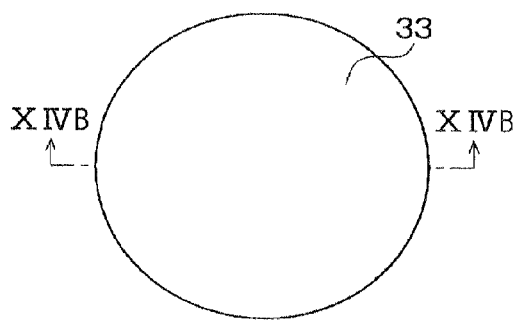
FIG. 14A, FIG. 14C, FIG. 14E, and FIG. 14G are plan views showing manufacturing processes of a SiC single crystal according to a fifth embodiment.
Figure 14B:
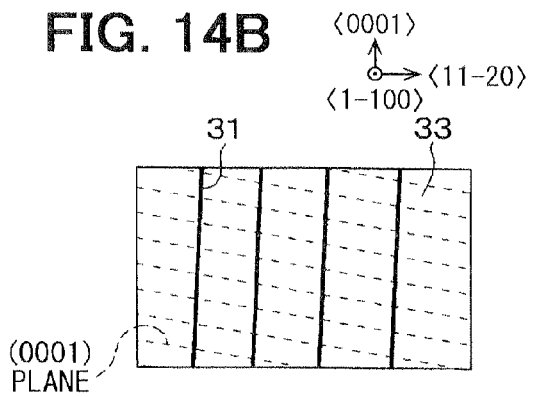
FIG. 14B is a cross-sectional view showing a first substrate taken along line XIVB-XIVB in FIG. 14A.
Figure 14C:
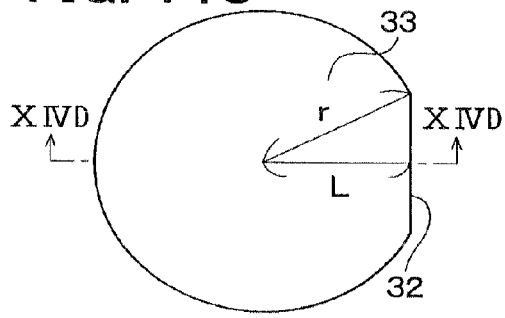
Figure 14D:
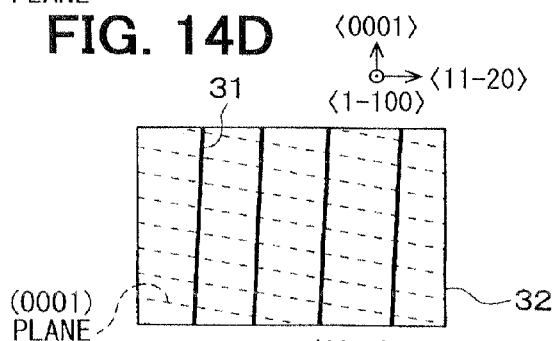
FIG. 14D is a cross-sectional view showing a first substrate taken along line XIVD-XIVD in FIG. 14C.

Firstly, as shown in FIG. 14A and FIG. 14B, the first substrate 33 having a cylindrical shape and having an offset angle is prepared. Then, as shown in FIG. 14C and FIG. 14D, an a-plane 32 that is perpendicular to the (0001) plane is formed at an end portion of the first substrate 33 in the <11-20> direction, for example, by cutting or grinding.

Figure 14E:
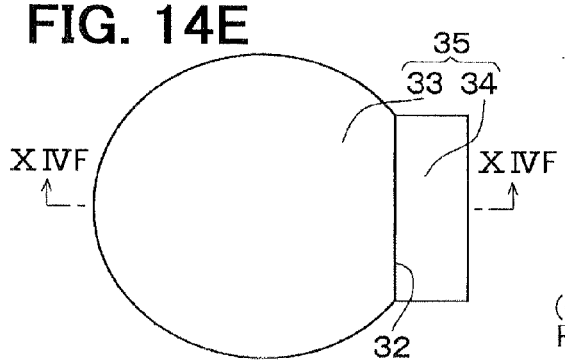
Figure 14F:
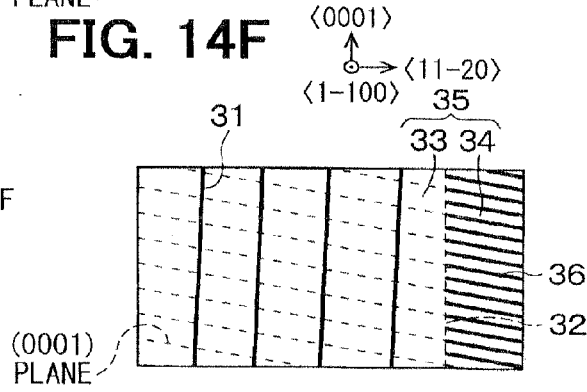
FIG. 14F is a cross-sectional view showing a second substrate taken along line XIVF-XIVF in FIG. 14E.
Figure 14G:
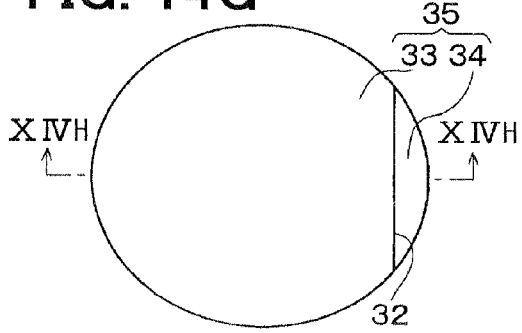
Figure 14H:
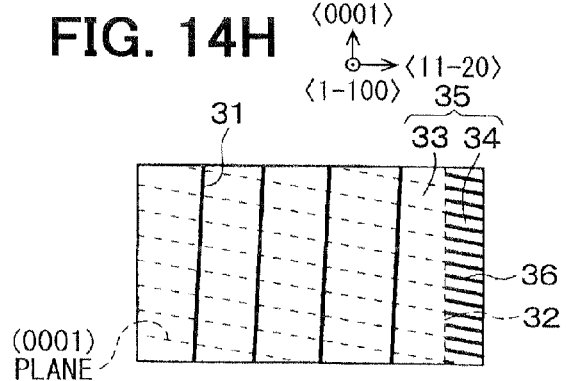
FIG. 14H is a cross-sectional view showing a second substrate taken along line IXV-IXVH in FIG. 14G.

Next, as shown in FIG. 14E and FIG. 14F, a SiC single crystal 34 is grown on the a-plane 32 in a manner similar to the process shown in FIG. 2B, and thereby a second substrate 35 including the first substrate 33 and the SiC single crystal 34 is formed. Then, as shown in FIG. 14G and FIG. 14H, the second substrate 35 is cut into a cylindrical shape. After that, the second substrate 35 is cut out in a manner similar to the first embodiment, and the seed crystal 30 having a circular growth surface 30a can be manufactured. Because the first substrate 33 used in the present embodiment has the offset angle, the second substrate 35 can be cut out in parallel with the surface of the first substrate 33.

In the process shown in FIG. 14C and FIG. 14D, the a-plane 32 may be formed as follows. When a SiC single crystal 40 is grown on the growth surface 30a of the seed crystal 30, a stacking fault 37 grows in the SiC single crystal 40 while spreading from a portion where the stacking fault 37 is introduced. Specifically, because the SiC single is hexagonal, the stacking fault 37 spreads into a regular triangle shape in which the portion where the stacking fault 37 is introduced is a vertex. Thus, in a case where the growth surface 30a of the seed crystal 30 is formed into a circular shape, if the stacking fault generation region 30b is formed only at a portion too close to an end in the <11-20> direction, there is a possibility that the stacking fault 37 is not generated at an end portion in the <0001> direction and an end portion in an opposite direction of the <0001> direction and the threading dislocations 31 inherited in the SiC single crystal 31 cannot collide against the portion where the stacking fault 37 is generated.

Thus, when a radius of the first substrate 33 is "r," and a shortest distance from a center of the first substrate 33 and the a-plane 32 is "L," the a-plane 32 may be formed so as to satisfy a relationship of $L \leq 0.5 \times 3^{(1/2)} \times r$. Accordingly, when the SiC single crystal 40 is grown, the stacking fault 37 can be inherited to almost the whole area of the SiC single crystal 40, and the threading dislocations 31 inherited in the SiC single crystal 40 can collide against the portion where the stacking fault 37 is generated.

Also in the present embodiment, the process shown in FIG. 14E and FIG. 14F can be performed, for example, with disposing the first substrate 33 in the housing portion of the lid 10b in a manner similar to the first embodiment.

As described above, also in a case where the first substrate 33 has a cylindrical shape, effects similar to the effects of the first embodiment can be achieved.

Sixth Embodiment

A manufacturing method of a SiC single crystal according to a sixth embodiment will be described below. In the present embodiment, a shape of a first substrate 33 is changed from the shape of the first substrate 33 according to the fifth embodiment, and the rest of the manufacturing method is similar to that of the manufacturing method according to the fifth embodiment. Thus, a description about the rest is omitted.

Figure 15:
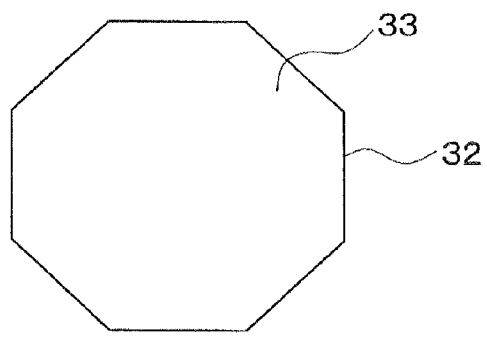
FIG. 15 is a plan view showing a first substrate according to a sixth embodiment.

In the present embodiment, as shown in FIG. 15, the first substrate 33 has an octagonal column shape having an a-plane 32. In the present manufacturing method, compared with the manufacturing method of the fifth embodiment, when the process shown in FIG. 14E and FIG. 14F is performed, a protection member can be easily arranged. In the process shown in FIG. 14E and FIG. 14F, the protection layer is attached to a portion of the first substrate 33 other than the a-plane 32. When the portion of the first substrate 33 other than the a-plane 32 has a circular shape, that is, has a curvature, it is difficult to attach the protection member. When the first substrate 33 has the octagonal column shape, the first substrate 33 does not have a portion having a curvature, and the protection member can be easily attached while achieving effects similar to the effects of the fifth embodiment.

Other Embodiments

In each of the above-described embodiments, the example in which the SiC single crystal 40 is formed on the seed crystal 30 by the sublimation recrystallization method as an example is described. However, the present disclosure is not limited to the above-described example. For example, the present disclosure can also be applied to a gas supply method in which the SIC single crystal 40 is formed on the seed crystal by introducing source gas in the crucible 10.

In each of the first embodiment, the fifth embodiment, and the sixth embodiment, the (11-20) plane is used as the a-plane 32 as an example. The (1-100) plane may also be used as the a-plane 32.

In the first embodiment, the fifth embodiment, and the sixth embodiment, the examples in which the seed crystal 30 is prepared using the first substrate 33 that has the a-plane 32 perpendicular to the (0001) plane are described. However, the first substrate 33 is not limited to the above-described example. For example, the seed crystal 30 may also be formed using a first substrate having a surface that has an angle within a range from 30 degrees to 150 degrees with the (0001) plane and is parallel to the <1-100> direction. As described in the first embodiment, even when the a-plane 32 is not grown in the direction perpendicular to the a-plane 32, growth in the a-axis direction becomes dominant and the stacking fault 36 is introduced when the angle between the growth surface of the SIC single crystal 34 and the (0001) plane is greater than 30 degrees. A surface on which the SIC single crystal 34 is not limited to a plane parallel with the <1-100> direction and may also be parallel to the <11-20> plane. In the third embodiment, the example in which the ramp 30c is the a-plane perpendicular to the (0001) plane is described. However, the ramp 30c is not required to be the a-plane perpendicular to the (0001) plane. As shown in FIG. 6A and FIG. 6B, when the offset angle between the (0001) plane and the growth surface 30a is 30 degrees, the stacking fault not depending on the stacking fault generation region 30b is generated in the SIC single crystal 40. Thus, when the angle between the (0001) plane and the ramp 30c is greater than 30 degrees, the stacking fault 37 can be generated in the SiC single crystal 40, and similar effects can be achieved.

Figure 16:
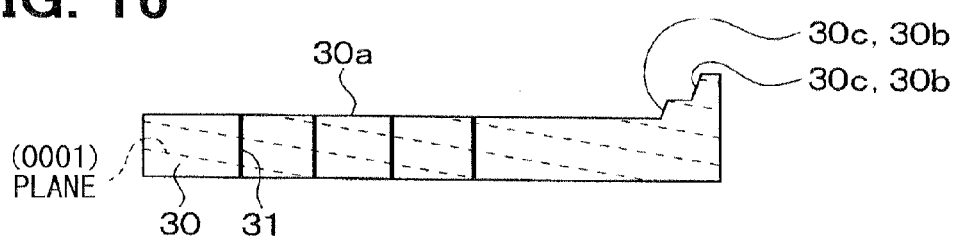
FIG. 16 is a cross-sectional view showing a seed crystal according to another embodiment.
Figure 17:
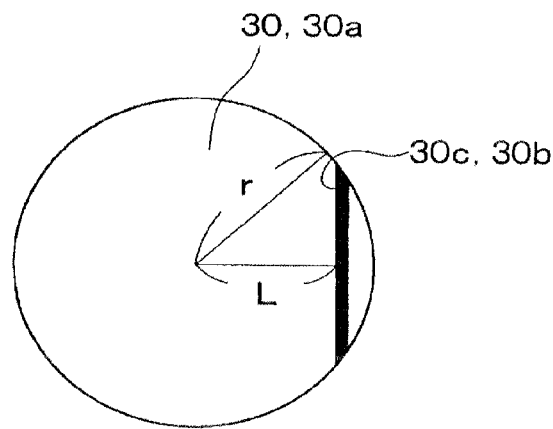
FIG. 17 is a plan view showing a seed crystal according to another embodiment.

In the third embodiment, the example in which one ramp 30c is provided is described. The seed crystal 30 may also have a plurality of ramps 30c whose height from the growth surface 30a increases in a stepwise manner in the offset direction. In other words, the seed crystal 30 may also have a stepped portion at the end portion of the growth surface 30a in the offset direction. For example, as shown in FIG. 16, the seed crystal 30 may have a stepped portion having two ramps 30. Heights of the ramps 30 from the growth surface 30a are different from each other and the heights increases in the offset direction in a stepwise manner. When the seed crystal 30 has a plurality of ramps 30c, the stacking fault 37 is easily generated when the SiC single crystal 40 is grown on the seed crystal 30.

In the fifth embodiment, a substrate that does not have an offset angle (so-called on-substrate) may also be used as the first substrate 33. In the present case, in view of the offset angle of the seed crystal 30 and the shape of the growth surface 30a, a portion where the a-plane 32 is formed may be adjusted so that the stacking fault 37 can be generated in almost the whole area of the SiC single crystal 40 when the SiC single crystal 40 is grown.

In the sixth embodiment, the example in which the first substrate 33 has the octagonal column shape is described. However, the first substrate 33 may also have a hexagonal column shape.

Figure 18:
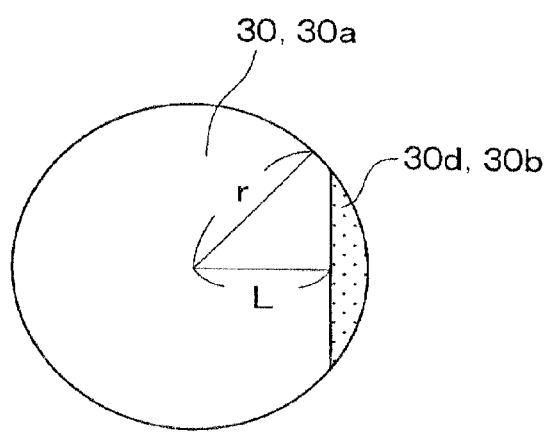
FIG. 18 is a plan view showing a seed crystal according to another embodiment.

The above-described embodiments may be combined. For example, the third embodiment and the fifth embodiment may be combined, and the seed crystal 30 may be formed by preparing a substrate having a circular column shape and forming a ramp 30c in the substrate. As shown in FIG. 18, the fourth embodiment and the fifth embodiment may also be combined, and the seed crystal 30 may be formed by preparing a substrate having a circular column shape and forming a broken layer 30 in the substrate. Although FIG. 18 is not a cross-sectional view, the broken layer 30d is illustrated with hatching so as to make the structure easy to understand. Also in cases where the stacking fault generation region 30b is formed by forming the ramp 30c or the broken layer 30d in the substrate having the circular column shape, the stacking fault generation region 30b may be formed so as to satisfy a relationship of $L \leq 0.5 \times 3^{(1/2)} \times r$.

What is claimed is:

1. A manufacturing method of a silicon carbide single crystal comprising:
   preparing a seed crystal made of silicon carbide, the seed crystal having a growth surface and a stacking fault generation region, the seed crystal including a threading dislocation that reaches the growth surface, the growth surface inclined at a predetermined angle from a (0001) plane, the stacking fault generation region configured to cause a stacking fault in the silicon carbide single crystal when the silicon carbide single crystal is grown, the stacking fault generation region located at an end portion of the growth surface in an offset direction that is a direction of a vector defined by projecting a normal vector of the (0001) plane onto the growth surface;
   joining the seed crystal to a pedestal; and
   growing the silicon carbide single crystal on the growth surface of the seed crystal,
   wherein the preparing the seed crystal includes:
     preparing a first substrate that includes the threading dislocation and has a surface inclined from the (0001) plane at an angle within a range from 30 degrees to 150 degrees;
     growing another silicon carbide single crystal on the surface of the first substrate to form a second substrate that includes the first substrate and the another silicon carbide single crystal; and
     cutting out the seed crystal from the second substrate at a plane inclined at the predetermined angle from the (0001) plane,
   wherein a cut-out surface of the second substrate forms the growth surface of the seed crystal and a cut-out surface of the another silicon carbide single crystal forms the stacking fault generation region, and
   wherein the surface of the first substrate is parallel to a <1-100> direction.

2. The manufacturing method according to claim 1,
   wherein the preparing the first substrate includes forming a broken layer on the surface of the first substrate, and
   wherein the broken layer is a layer in which a crystal structure is broken.

3. The manufacturing method according to claim 1,
wherein the preparing the first substrate includes preparing the first substrate doped with nitrogen at a first concentration, and
wherein the growing the another silicon carbide single crystal includes growing the another silicon carbide single crystal doped with nitrogen at a second concentration that is different from the first concentration.

4. The manufacturing method according to claim 3,
wherein the second concentration is greater than the first concentration.

5. The manufacturing method according to claim 1,
wherein the preparing the seed crystal includes preparing a first substrate and a second substrate,
wherein the first substrate has a surface inclined at the predetermined angle from the (0001) plane and forming the growth surface, and the first substrate includes the threading dislocation that reaches the surface of the first substrate,
wherein the second substrate has a surface inclined at the predetermined angle from the (0001) plane and forming the growth surface, and the second substrate includes a stacking fault that reaches the surface of the second substrate,
wherein the joining the seed crystal to the pedestal includes disposing the first substrate and the second substrate on the pedestal in such a manner that a plane direction of the first substrate and the plane direction of the second substrate correspond to each other and the second substrate is located on a side of the first substrate in the offset direction, and
wherein the surface of the second substrate forms the stacking fault generation region.

6. The manufacturing method according to claim 1,
wherein the preparing the seed crystal further includes forming a ramp that protrudes from the end portion of the growth surface in the offset direction, and
wherein the ramp forms the stacking fault generation region.

7. The manufacturing method according to claim 6,
wherein the preparing the seed crystal further includes forming a broken layer on the ramp, and
wherein the broken layer is a layer in which a crystal structure is broken.

8. The manufacturing method according to claim 7,
wherein the preparing the seed crystal further includes forming more ramp protruding from the end portion of the growth surface in the offset direction, and
wherein heights of the ramps from the growth surface are different from each other and the heights of the ramps increase in the offset direction in a stepwise manner.

9. The manufacturing method according to claim 1,
wherein the preparing the seed crystal further includes forming a broken layer at the end portion of the growth surface in the offset direction,
wherein the broken layer forms the stacking fault generation region, and
wherein the broken layer is a layer in which a crystal structure is broken.

10. The manufacturing method according to claim 1,
wherein the growth surface of the seed crystal has a circular shape.

11. The manufacturing method according to claim 10,
wherein the growth surface of the seed crystal has a radius "r," and a shortest distance "L" from a center of the growth surface to the stacking fault generation region satisfies a relationship of $L \leq 0.5 \times 3^{(1/2)} \times r$.

12. The manufacturing method according to claim 1,
wherein the predetermined angle between the (0001) plane and the growth surface is greater than 4 degrees.

13. The manufacturing method according to claim 1,
wherein the predetermined angle between the (0001) plane and the growth surface is less than 30 degrees.

* * * * *